United States Patent [19]

Sakuragi et al.

[11] Patent Number: 4,716,305
[45] Date of Patent: Dec. 29, 1987

[54] SWITCHING DEVICE HAVING A FEEDBACK MEANS FOR RENDERING A CONTROL CIRCUIT INOPERATIVE IN RESPONSE TO A CURRENT SUPPLY CIRCUIT BEING INOPERATIVE

[75] Inventors: Takamasa Sakuragi, Hiratsuka; Ikuo Fushimi, Ebina, both of Japan

[73] Assignee: Canon Kabushiki Kaisha, Tokyo, Japan

[21] Appl. No.: 833,616

[22] Filed: Feb. 27, 1986

[30] Foreign Application Priority Data

Mar. 1, 1985 [JP] Japan .................. 60-38899

[51] Int. Cl.[4] .............. H03K 3/01; H03K 17/60; H03F 3/04; G05F 3/16
[52] U.S. Cl. .................. 307/296 R; 307/246; 307/254; 323/317; 330/288
[58] Field of Search .............. 307/253, 254, 255, 313, 307/296 R, 252 K, 252 J, 242, 246; 323/312, 316, 317; 330/288

[56] References Cited

U.S. PATENT DOCUMENTS

| | | | |
|---|---|---|---|
| 3,573,595 | 4/1971 | Galluppi | 323/312 |
| 3,881,150 | 4/1975 | Gay | 307/297 |
| 4,540,893 | 9/1985 | Bloomer | 307/255 |

FOREIGN PATENT DOCUMENTS 0048119  3/1983  Japan .................. 323/112

Primary Examiner—John S. Heyman
Assistant Examiner—Trong Quang Phan
Attorney, Agent, or Firm—Fitzpatrick, Cella, Harper & Scinto

[57] ABSTRACT

A switching device includes a current supply circuit, a control circuit, and means for feedback from the current supply circuit to the control circuit. The current supply circuit supplies current to a load. The control circuit controls operating and non-operating of the current supply circuit. When the current supply circuit is inoperative, means for feedback renders the control circuit inoperative.

1 Claim, 1 Drawing Figure

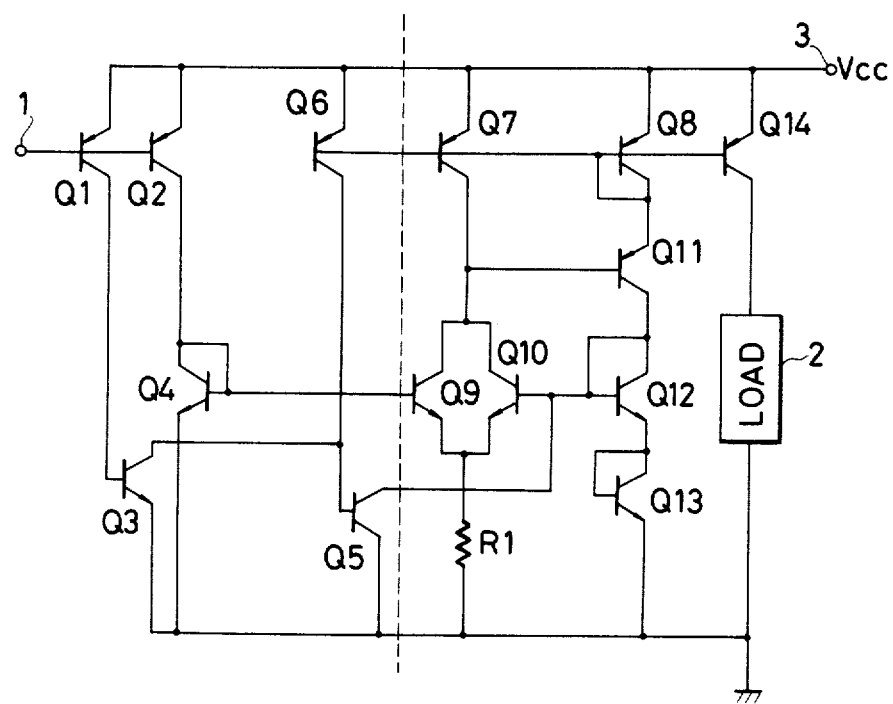

SWITCHING DEVICE HAVING A FEEDBACK MEANS FOR RENDERING A CONTROL CIRCUIT INOPERATIVE IN RESPONSE TO A CURRENT SUPPLY CIRCUIT BEING INOPERATIVE

BACKGROUND OF THE INVENTION

1. Field of the Invention

The present invention relates to a switching device, and more particularly to a switching device which controls the supply of power to a load by a control signal.

The present invention may be applicable to a switching device in an electrical apparatus in which the saving of power is required.

2. Related Background Art

In a conventional switching device, power is consumed in a control circuit for a current supply circuit even if the current supply circuit which supplies current to a load is nonoperative. Accordingly, such circuits waste power. It is important to suppress power consumption in the nonoperative state particularly in a battery-operated electrical apparatus.

SUMMARY OF THE INVENTION

It is an object of the present invention to provide a novel and improved switching device.

It is another object of the present invention to provide a switching device having a current supply circuit for supplying a current to a load, a control circuit for controlling operating and non-operating states of the current supply circuit, and feedback means from the current supply circuit to the control circuit for rendering the control circuit inoperative when the current supply circuit is inoperative.

BRIEF DESCRIPTION OF THE DRAWING

A single drawing shows a circuit diagram of one embodiment of the switching device of the present invention.

DESCRIPTION OF PREFERRED EMBODIMENT

The accompanying drawing shows a circuit diagram of one embodiment of the switching device of the present invention.

A control circuit is constructed by PNP transistors Q1, Q2 and Q6 and NPN transistors Q3, Q4 and Q5 and a self-biased constant current circuit is constracted by PNP transistors Q7, Q8, Q11 and Q14, NPN transistors Q9, Q10, Q12 and Q13, and a resistor R1. The control circuit controls operating and non-operating states of the constant current circuit by a control signal supplied to a control terminal 1. The constant current circuit is a current supply circuit which supplies a current to a load 2 in the operating state and does not supply the current in the non-operating state.

The present embodiment is described in more detail. Base electrodes of the transistors Q1 and Q2 are connected in common to the control terminal 1 and emitter electrodes thereof are connected in common to a positive terminal 3 of a power supply Vcc. A collector electrode of the transistor Q1 is connected to a base electrode of the transistor Q3 and a collector electrode of the transistor Q2 is connected to a collector electrode and a base electrode of the transistor Q4. An emitter of the transistor Q3 is grounded and a collector electrode thereof is connected to a base electrode of the transistor Q5 and a collector electrode of the transistor Q6. The collector electrode and the base electrode of the transistor Q4 are connected to a base electrode of the transistor Q9, and an emitter electrode of the transistor Q4 is grounded. As will be described later, the transistor Q4 and Q9 constitute a start-up circuit for starting the constant current circuit. The base electrode of the transistor Q5 and the collector electrode of the transistor Q3 are connected to the collector electrode of the transistor Q6, and an emitter electrode transistor Q5 is grounded. Accordingly, when the transistor Q5 is ON, a base current to the transistor Q5 is supplied through the transistor Q6.

An emitter electrode of the transistor Q6 is connected to the positive terminal 3 of the power supply and a base electrode thereof is connected to base electrodes of the transistors Q7, Q8 and Q14. The collector electrode of the transistor Q6 is connected to the base electrode of the transistor Q5. Thus, the transistor Q6 functions as feedback means from the constant current circuit to the control circuit. A collector electrode of the transistor Q7 is connected to a base electrode of the transistor Q11 and collector electrodes of the transistors Q9 and Q10. Emitter electrodes of the transistor Q9 and Q10 are grounded through the resistor R1. The base electrode of the transistor Q8 is connected to a collector electrode thereof, and an emitter electrode of the transistor Q11. A collector electrode of the transistor Q11 is connected to a collector electrode and a base electrode of the transistor Q12, and the base electrode of the transistor Q12 is connected to a base electrode of the transistor Q10 and the collector electrode of the transistor Q5. An emitter electrode of the transistor Q12 is connected to a base electrode and a collector electrode of the transistor Q13, and an emitter electrode of the transistor Q13 is grounded.

A collector electrode of the transistor Q14 is grounded through the load 2 so that a current is supplied to the load 2 only when the transistor Q14 is ON. Emitter electrodes of the transistors Q7, Q8 and Q14 are connected to the positive terminal 3 of the power supply.

The operative of the present embodiment is now explained.

When the control terminal 1 is at a low level, the transistors Q1 and Q2 are ON and current flow into the base electrodes of the transistors Q3 and Q4 to turn them ON. As the transistor Q3 is turned ON, the transistor Q5 is turned OFF and a current flows into the base electrode of the transistor Q9 which is connected to the base electrode of the transistor Q4. Thus, the transistor Q9 is turned ON.

A base current to the transistor Q11 flows by a collector current of the transistor Q9 which is now ON so that the transistor Q11 is turned ON. As transistor Q11 is turned ON, a current flows through the transistors Q8, Q11, Q12 and Q13. Since base currents also flow into the transistors Q6, Q7 and Q14 as well as the transistor Q8, those transistors are turned ON and a current is supplied to the load 2 through the transistor Q14 which forms a current mirror circuit. Because the transistor Q5 is now OFF, base currents flow into the transistor Q10 as well as the transistor Q12 and the transistor Q10 is turned ON. However, since the base electrode of the transistor Q10 is biased by the transistors Q12 and Q13 which the base electrode of the transistor Q9 is biased by the transistor Q4, the transistor Q9 is turned OFF when the transistor Q10 is turned ON. Thus, the transistor Q9 is ON only when the constant current circuit is operational and it is normally OFF. Thus, when the control terminal 1 is at the low level, the control circuit activates the constant current circuit, which supplies the current to the load 2.

When a high level signal is applied to the control terminal 1 and the control terminal 1 is opened, the transistors Q1 and Q2 are turned OFF and no base current flows to the transistors Q3 and Q4 and they are turned OFF.

As the transistor Q3 is turned OFF, a base current flows to the base terminal of the transistor Q5 through the transistor Q6 and the transistor Q5 is turned ON. As a result, the base potentials of the transistors Q10 and Q12 drop to approximately ground potential and the transistors Q10 and Q12 are turned OFF. Since the transistor Q9 is kept OFF, no base current flows to the Q11 and the transistor Q11 is turned OFF. As a result, no base current flow to the transistors Q6, Q7, Q8 and Q14 and they are turned OFF. Thus, the constant current circuit is rendered inoperative and the current is not supplied to the load 2. Since the transistor Q6 is turned OFF, the base current to the transistor Q5 does not flow and the transistor Q5 is turned OFF. The constant current circuit does not operate because the transistor Q11 has been turned OFF although the transistor Q5 is now turned OFF.

In summary, when the high level signal is applied to the control terminal 1, the transistors Q5 is turned OFF and the control circuit renders the constant current circuit inoperative. As the constant current circuit is rendered inoperative the transistor Q6 is also turned OFF and the transistor Q5 is turned OFF. Accordingly as the constant current circuit is rendered inoperative the control circuit is also rendered inoperative. Thus, all transistors of the control circuit and the constant current circuit are turned OFF and the current flowing from the power supply to the ground becomes essentially zero.

A switching device having opposite conductivity types (PNP or NPN) of the transistors to those of the present embodiment can be easily constructed based on the present embodiment.

As described above, the switching device of the present embodiment can reduce the power consumption because the current consumption in the non-operative state in which no current is supplied to the load is essentially zero.

We claim:

1. A switching device comprising:
    a current supply circuit for supplying a current to a load having operating and non-operating states;
    a control circuit for controlling said operating and non-operating states of said current supply circuit; and
    feedback means connected between said current supply circuit and said control circuit for rendering said control circuit inoperative in response to said current supply circuit being inoperative.

* * * * *

UNITED STATES PATENT AND TRADEMARK OFFICE
CERTIFICATE OF CORRECTION

PATENT NO. : 4,716,305
DATED : December 29, 1987
INVENTOR(S) : T. SAKURAGI, ET AL.

It is certified that error appears in the above-identified patent and that said Letters Patent is hereby corrected as shown below:

COLUMN 1

Line 47, "constracted" should read --constructed--.

COLUMN 2

Line 3, "transistor" should read --transistors--.
Line 22, "transistor" should read --transistors--.
Line 41, "operative" should read --operation--.
Line 44, "flow" should read --flows--.
Line 65, "which" should read --while--.

COLUMN 3

Lines 16-17, "the/Q11" should read
          --the transistor Q11--.
Line 18, "flow" should read --flows--.
Line 28, "transistors" should read --transistor--.

Signed and Sealed this

Fourteenth Day of June, 1988

Attest:

DONALD J. QUIGG

*Attesting Officer*          *Commissioner of Patents and Trademarks*